United States Patent
Li et al.

(10) Patent No.: US 12,016,249 B2
(45) Date of Patent: Jun. 18, 2024

(54) PIEZOELECTRIC SENSOR AND MANUFACTURING METHOD THEREOF, METHOD FOR RECOGNIZING FINGERPRINT, AND ELECTRONIC DEVICE

(71) Applicant: BOE TECHNOLOGY GROUP CO., LTD., Beijing (CN)

(72) Inventors: Xiufeng Li, Beijing (CN); Yingming Liu, Beijing (CN); Yuzhen Guo, Beijing (CN); Chenyang Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 747 days.

(21) Appl. No.: 17/264,912

(22) PCT Filed: May 29, 2020

(86) PCT No.: PCT/CN2020/093190
§ 371 (c)(1),
(2) Date: Feb. 1, 2021

(87) PCT Pub. No.: WO2020/259201
PCT Pub. Date: Dec. 30, 2020

(65) Prior Publication Data
US 2021/0305487 A1    Sep. 30, 2021

(30) Foreign Application Priority Data
Jun. 24, 2019    (CN) .......................... 201910547611.0

(51) Int. Cl.
*H10N 30/30*    (2023.01)
*G06V 40/13*    (2022.01)
(Continued)

(52) U.S. Cl.
CPC ....... *H10N 30/302* (2023.02); *G06V 40/1306* (2022.01); *H10N 30/05* (2023.02); *H10N 30/10516* (2023.02); *H10N 30/871* (2023.02)

(58) Field of Classification Search
CPC .......... H10N 30/302; H10N 30/10516; H10N 30/871; H10N 30/05
See application file for complete search history.

(56) References Cited

U.S. PATENT DOCUMENTS

| 4,359,726 A | 11/1982 | Lewiner et al. |
| 10,303,279 B2 | 5/2019 | Wang et al. |

(Continued)

FOREIGN PATENT DOCUMENTS

| CN | 1408548 A | 4/2003 |
| CN | 101277099 A | 10/2008 |

(Continued)

OTHER PUBLICATIONS

First office action issued in Chinese Patent Application No. 201910547611.0 with search report.

*Primary Examiner* — J. San Martin
(74) *Attorney, Agent, or Firm* — Chiwin Law LLC

(57) ABSTRACT

A piezoelectric sensor and a manufacturing method thereof, a method for recognizing a fingerprint, and an electronic device are disclosed. The piezoelectric sensor includes a first electrode layer and a second electrode layer which are opposite to each other and a piezoelectric layer. The piezoelectric layer is between the first electrode layer and the second electrode layer and includes a plurality of piezoelectric units arranged at intervals and an insulation layer between adjacent piezoelectric units of the plurality of piezoelectric units. The first electrode layer includes a plurality of sub-electrodes corresponding to the plurality of piezoelectric units, or the second electrode layer includes a plurality of sub-electrodes corresponding to the plurality of (Continued)

piezoelectric units; or both the first electrode layer and the second electrode layer include a plurality of sub-electrodes corresponding to the plurality of piezoelectric units.

19 Claims, 7 Drawing Sheets

(51) Int. Cl.
*H10N 30/00* (2023.01)
*H10N 30/05* (2023.01)
*H10N 30/87* (2023.01)

(56) References Cited

U.S. PATENT DOCUMENTS

| | | | |
|---|---|---|---|
| 2004/0163478 A1 | 8/2004 | Xu et al. | |
| 2016/0163958 A1 | 6/2016 | Park et al. | |
| 2020/0293736 A1* | 9/2020 | Liu | G06F 3/0412 |
| 2020/0357379 A1 | 11/2020 | Garlepp et al. | |
| 2020/0372231 A1 | 11/2020 | Liu et al. | |
| 2021/0304722 A1* | 9/2021 | Kho | G06F 1/1605 |
| 2021/0331204 A1* | 10/2021 | Zhang | G01H 11/08 |
| 2022/0230009 A1* | 7/2022 | Yao | G06V 40/1306 |
| 2022/0376005 A1* | 11/2022 | Qi | G02F 1/1333 |
| 2023/0095588 A1* | 3/2023 | Liu | G06V 40/1306 |
| | | | 345/177 |
| 2023/0280857 A1* | 9/2023 | Komatsu | H10N 30/308 |
| | | | 345/173 |

FOREIGN PATENT DOCUMENTS

| | | |
|---|---|---|
| CN | 101630946 A | 1/2010 |
| CN | 205281517 U | 6/2016 |
| CN | 105843446 A | 8/2016 |
| CN | 106353702 A | 1/2017 |
| CN | 207182321 U | 4/2018 |
| CN | 108960218 A | 12/2018 |
| CN | 109219846 A | 1/2019 |
| CN | 109494295 A | 3/2019 |
| CN | 109815918 A | 5/2019 |
| CN | 109829419 A | 5/2019 |
| CN | 110265544 A | 9/2019 |

\* cited by examiner

PIEZOELECTRIC SENSOR AND MANUFACTURING METHOD THEREOF, METHOD FOR RECOGNIZING FINGERPRINT, AND ELECTRONIC DEVICE

CROSS REFERENCE TO RELATED APPLICATIONS

This application is a U.S. National Phase Entry of International Application No. PCT/CN2020/093190 filed on May 29, 2020, designating the United States of America and claiming priority to Chinese Patent Application No. 201910547611.0, filed on Jun. 24, 2019. The present application claims priority to and the benefit of the above-identified applications and the above-identified applications are incorporated by reference herein in their entirety.

TECHNICAL FIELD

Embodiments of the present disclosure relate to a piezoelectric sensor and a manufacturing method thereof, a method for recognizing a fingerprint and an electronic device.

BACKGROUND

The working principle of a piezoelectric sensor is to use the inverse piezoelectric effect of piezoelectric material (e.g., serving as a transmitter) to emit ultrasonic waves with a specific frequency (applying alternating voltage in a specific direction to make piezoelectric material vibrate). During the propagation process, the ultrasonic waves undergo energy attenuation or phase change because of contact with the object to be measured, and when they reach the piezoelectric material serving as a receiver, a positive piezoelectric effect occurs (charge is generated under the pressure of the ultrasonic waves), thus determining the energy change or phase change of the ultrasonic waves to realize sensing detection. Specifically, physical environment in the ultrasonic propagation path can be judged by means of piezoelectric sensors, such as fingerprint recognition, touch switches, pressure sensors, human internal organs imaging, metal product flaw detection, etc. In the field of biometrics (such as fingerprint recognition), piezoelectric sensors have the advantages of anti-interference, multi-dimensional imaging and easy integration compared with other technical means (capacitive type, optical type, etc.).

SUMMARY

At least one embodiment of the present disclosure provides a piezoelectric sensor, the piezoelectric sensor comprises a first electrode layer and a second electrode layer which are opposite to each other and a piezoelectric layer which is between the first electrode layer and the second electrode layer and comprises a plurality of piezoelectric units arranged at intervals and an insulation layer between adjacent piezoelectric units of the plurality of piezoelectric units. The first electrode layer comprises a plurality of sub-electrodes corresponding to the plurality of piezoelectric units; or the second electrode layer comprises a plurality of sub-electrodes corresponding to the plurality of piezoelectric units; or both the first electrode layer and the second electrode layer comprise a plurality of sub-electrodes corresponding to the plurality of piezoelectric units.

According to at least one embodiment of the present disclosure, the plurality of piezoelectric units are arranged in an array, and the plurality of sub-electrodes are in one-to-one correspondence to the plurality of piezoelectric units.

According to at least one embodiment of the present disclosure, Young's modulus of a material of the insulation layer is smaller than Young's modulus of a material of the piezoelectric unit.

According to at least one embodiment of the present disclosure, the Young's modulus of the material of the insulation layer is not greater than 2 GPa.

According to at least one embodiment of the present disclosure, the piezoelectric sensor further comprises an insulation structure, and the insulation structure is between adjacent sub-electrodes of the plurality of sub-electrodes.

According to at least one embodiment of the present disclosure, one selected from a group consisting of the first electrode layer and the second electrode layer is a planar electrode, and the other selected from the group consisting of the first electrode layer and the second electrode layer comprises the plurality of sub-electrodes corresponding to the plurality of piezoelectric units.

According to at least one embodiment of the present disclosure, the piezoelectric sensor further comprises an auxiliary layer, and the auxiliary layer is at at least one of the following positions: between the first electrode layer and the piezoelectric layer; or between the second electrode layer and the piezoelectric layer.

According to at least one embodiment of the present disclosure, the piezoelectric sensor further comprises at least one of the following elements: an excitation source which is electrically connected with the first electrode layer and the second electrode layer to excite the plurality of piezoelectric units to generate ultrasonic waves; or a phase controller which is electrically connected with the first electrode layer and the second electrode layer and is configured to independently modulate phase of a signal for exciting each of the plurality of piezoelectric units to generate ultrasonic waves.

According to at least one embodiment of the present disclosure, the piezoelectric sensor further comprises a piezoelectric sensing circuit, the piezoelectric sensing circuit comprises a storage capacitor, a first transistor, a second transistor, a third transistor and a fourth transistor, a control electrode of the first transistor is configured to receive a sampling control signal, a first electrode of the first transistor is configured to receive a bias signal, the second electrode layer, a second electrode of the first transistor, a first terminal of the storage capacitor and a control electrode of the second transistor are connected to a first node, a second terminal of the storage capacitor is connected to a first power supply voltage, a second electrode of the second transistor is connected to the first power supply voltage, a first electrode of the second transistor, a second electrode of the third transistor and a first electrode of the fourth transistor are connected to a second node, a control electrode of the third transistor and a first electrode of the third transistor are configured to receive a second power supply voltage, a second electrode of the fourth transistor serves as a signal output terminal of a signal reading circuit, and a control electrode of the fourth transistor is configured to receive an output control signal.

According to at least one embodiment of the present disclosure, the piezoelectric sensor further comprises a substrate, and the substrate is on a side of the first electrode layer away from the piezoelectric layer.

At least one embodiment of the present disclosure provides a method for recognizing a fingerprint. According to at least one embodiment of the present disclosure, the method comprises: exciting a piezoelectric sensor by an excitation source to generate ultrasonic waves; and receiving the ultrasonic waves reflected by a finger by the piezoelectric sensor and converting the ultrasonic waves that are received into electrical signals to realize fingerprint recognition. The piezoelectric sensor comprises: a first electrode layer and a second electrode layer which are opposite to each other; and a piezoelectric layer which is between the first electrode layer and the second electrode layer and comprises a plurality of piezoelectric units arranged at intervals and an insulation layer between adjacent piezoelectric units of the plurality of piezoelectric units, in which the first electrode layer comprises a plurality of sub-electrodes corresponding to the plurality of piezoelectric units; or the second electrode layer comprises a plurality of sub-electrodes corresponding to the plurality of piezoelectric units; or both the first electrode layer and the second electrode layer comprise a plurality of sub-electrodes corresponding to the plurality of piezoelectric units.

According to at least one embodiment of the present disclosure, the piezoelectric sensor further comprises a phase controller, the phase controller is electrically connected with the first electrode layer and the second electrode layer, and exciting the piezoelectric sensor by the excitation source to generate ultrasonic waves comprises: independently modulating phase of a signal used for exciting each of the piezoelectric units to generate the ultrasonic waves by the phase controller.

According to at least one embodiment of the present disclosure, independently modulating phase of the signal used for exciting each of the piezoelectric units to generate the ultrasonic waves comprises: adjusting phases of signals applied to the plurality of piezoelectric units so that the ultrasonic waves generated by the plurality of piezoelectric units have a maximum amplitude at a set position.

According to at least one embodiment of the present disclosure, the method further comprises: adjusting the phases of the signals applied to the plurality of piezoelectric units to change a direction of the maximum amplitude that is formed, so that the direction of the maximum amplitude is capable of being changed along a predetermined route.

According to at least one embodiment of the present disclosure, the method further comprises: converting the electrical signals, converted by the plurality of piezoelectric units, from AC signals to DC signals by a piezoelectric sensing circuit in the piezoelectric sensor; respectively storing the DC signals in a storage capacitor of the piezoelectric sensing circuit; and sequentially outputting the DC signals to a peripheral signal processor in a signal readout stage.

At least one embodiment of the present disclosure further provides a method of manufacturing the piezoelectric sensor according to any embodiment of the present disclosure. According to at least one embodiment of the present disclosure, the method comprises: forming a second electrode layer on a base substrate; forming a plurality of piezoelectric units arranged at intervals and an insulation layer between adjacent piezoelectric units of the plurality of piezoelectric units on the second electrode layer; and forming a first electrode layer on a side of the piezoelectric units away from the second electrode layer. The first electrode layer comprises a plurality of sub-electrodes corresponding to the plurality of piezoelectric units; or the second electrode layer comprises a plurality of sub-electrodes corresponding to the plurality of piezoelectric units; or both the first electrode layer and the second electrode layer comprise a plurality of sub-electrodes corresponding to the plurality of piezoelectric units.

According to at least one embodiment of the present disclosure, before forming the second electrode layer on the base substrate, the method further comprises: forming a piezoelectric sensing circuit on the base substrate, wherein the piezoelectric sensing circuit is between the second electrode layer and the base substrate; and in a case where the second electrode layer comprises a plurality of sub-electrodes corresponding to the plurality of piezoelectric units, forming the plurality of piezoelectric units arranged at intervals and the insulation layer between adjacent piezoelectric units of the plurality of piezoelectric units on the second electrode layer comprises: coating a polyvinylidene fluoride film on a side of the plurality of sub-electrodes away from the base substrate in a spinning manner, forming the plurality of piezoelectric units arranged in an array using the polyvinylidene fluoride film, and forming the insulation layer at gaps between the adjacent piezoelectric units.

According to at least one embodiment of the present disclosure, the method further comprises: providing a substrate on a side of the first electrode layer away from the piezoelectric layer.

At least one embodiment of the present disclosure further provides an electronic device. According to at least one embodiment of the present disclosure, the electronic device comprises the piezoelectric sensor according to any embodiment of the present disclosure.

According to at least one embodiment of the present disclosure, the electronic device further comprises a display screen, and the piezoelectric sensor is on a side of the display screen away from a light emitting side.

According to at least one embodiment of the present disclosure, the electronic device further comprises a cover plate, and the cover plate is on a side of the display screen away from the piezoelectric sensor and a thickness of the cover plate is in a range of 50 μm-200 μm.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
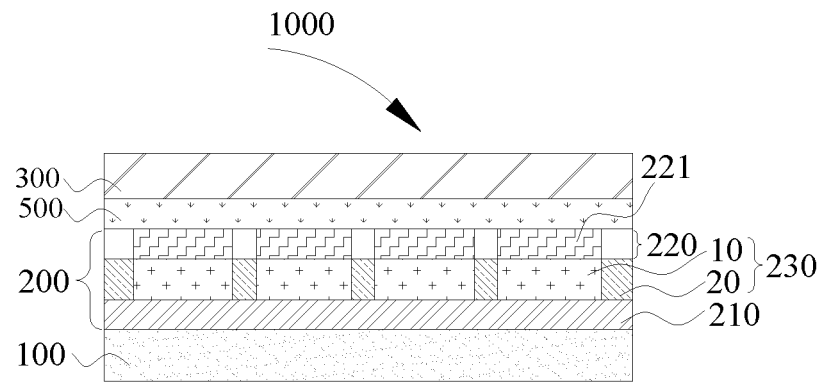
FIG. 1A shows a cross-sectional structural schematic diagram of a piezoelectric sensor provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Embodiments of the present disclosure are described in detail below, examples of which are shown in the accompanying drawings, in which identical or similar reference numerals denote identical or similar elements or elements having identical or similar functions throughout. The embodiments described below by referring to the accompanying drawings are exemplary and are only used to explain the present disclosure, and should not be understood as limiting the present disclosure.

Figure 1B:
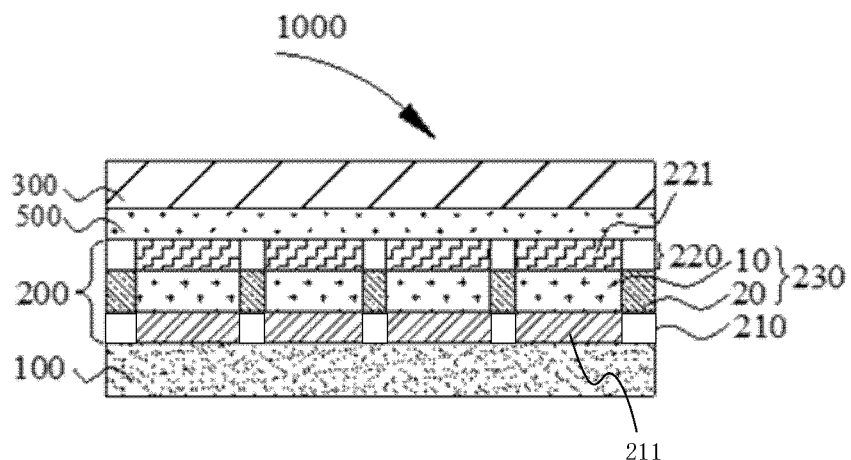
FIG. 1B shows a cross-sectional structural schematic diagram of a piezoelectric sensor provided by at least one embodiment of the present disclosure.
Figure 1C:
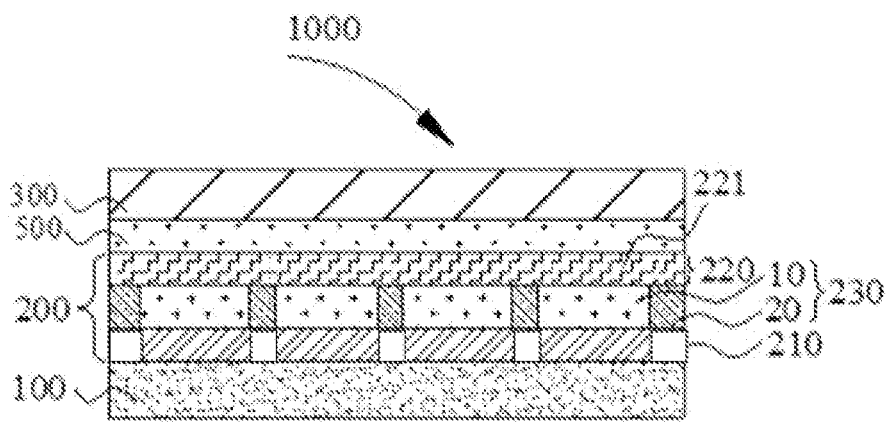
FIG. 1C shows a cross-sectional structural schematic diagram of a piezoelectric sensor provided by at least one embodiment of the present disclosure.
Figure 2:
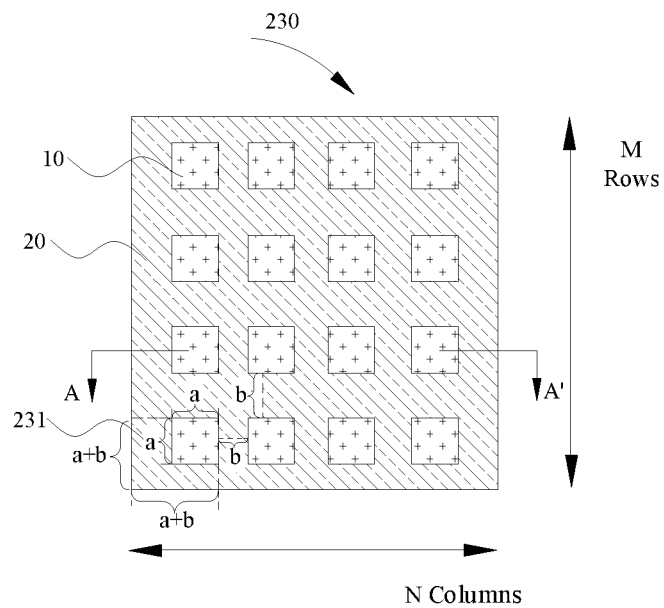
FIG. 2 shows a top structural schematic diagram of a piezoelectric layer provided by at least one embodiment of the present disclosure.

In one aspect of the present disclosure, the present disclosure provides a piezoelectric sensor. According to at least one embodiment of the present disclosure, referring to FIG. 1A-FIG. 1C and FIG. 2 (FIG. 1A-FIG. 1C are schematic cross-sectional structure diagrams of the piezoelectric sensor along the direction AA' in FIG. 2), the piezoelectric sensor 1000 includes a substrate 100 and a contact layer 300 which are opposite to each other, and a piezoelectric structure 200 between the substrate 100 and the contact layer 300.

The piezoelectric structure 200 includes a first electrode layer 210 on a side of the substrate 100 facing the contact layer 300, a piezoelectric layer 230 on a side of the first electrode layer 210 away from the substrate 100, and a second electrode layer 220 on a side of the piezoelectric layer 200 away from the substrate 100. The piezoelectric layer 230 includes a plurality of piezoelectric units 10 arranged at intervals, and an insulating layer 20 between adjacent piezoelectric units 10. The first electrode layer 210 and/or the second electrode layer 220, that is, at least one selected from a group consisting of the first electrode layer 210 and the second electrode layer 220, includes a plurality of sub-electrodes corresponding to the piezoelectric units 10 (for example, referring to FIG. 1A, the second electrode layer 220 includes at least one sub-electrode 221 corresponding to the piezoelectric unit 10). Therefore, the plurality of piezoelectric units 10 arranged at intervals can independently transmit/receive signals, and can focus and control the direction of ultrasonic signals emitted by the whole piezoelectric structure 200, so as to improve strength and resolution of the signals, increase an area of a monitoring region, reduce an occupied area of the piezoelectric sensors and improve the efficiency of human-computer interaction.

It should be known that in various embodiments of the present disclosure, the piezoelectric sensor 1000 is described as including the contact layer 300 for convenience of description, but it should be known that the contact layer 300 refers to another functional film layer on a side of the piezoelectric structure 200 close to the user in the case where the piezoelectric sensor 1000 is combined with other components in actual use. For example, in the case where the piezoelectric sensor is combined with a display screen and the display screen is located on the side of the piezoelectric structure close to the user, the display screen is the contact layer 300.

It should be noted that when the piezoelectric sensor 1000 works, the first electrode layer 210, the second electrode layer 220, and the piezoelectric layer 230 described above can be used as a transmitter and a receiver at the same time, that is, the same piezoelectric layer 230 can be used to transmit ultrasonic signals and receive reflected ultrasonic signals and convert them into electrical signals through different work sequences.

For convenience of understanding, the principle that the piezoelectric sensor according to the embodiment of the present disclosure achieves the above beneficial effects is briefly explained below.

The inventor found that the current piezoelectric sensor has a problem of low signal resolution. By in-depth research, the inventor found that the problem is caused by the signal crosstalk easily produced and insufficient signal strength in the current piezoelectric sensor. Specifically, when the piezoelectric sensor is applied (for example, when it is used for fingerprint recognition of an electronic device, etc.), the piezoelectric material and electrodes that constitute the piezoelectric sensor are usually integrated under the display screen of the electronic device, and then fingerprint recognition in a larger area can be realized on the whole display screen. However, in the current piezoelectric sensor, the piezoelectric material and the electrodes are all arranged in a whole layer (are all integral), and when the piezoelectric material arranged in a whole layer transmits or receives signals, the signals are prone to crosstalk, and energy of the signals are easy to dissipate, which leads to signal attenuation, thus reducing the signal resolution, weakening the discrimination of objects to be recognized (such as a fingerprint), and reducing the sensitivity and accuracy of fingerprint recognition.

According to the piezoelectric sensor of the embodiment of the present disclosure, the piezoelectric layer (i.e., a piezoelectric material layer) is patterned, that is, the piezoelectric layer includes a plurality of piezoelectric units arranged at intervals, and the plurality of piezoelectric units arranged at intervals independently transmit/receive signals, that is, the plurality of piezoelectric units can form a plurality of independent piezoelectric sensor subunits. Therefore, the ultrasonic signals emitted by the whole piezoelectric layer can be focused and directed by independently adjusting the signal emission condition of each piezoelectric unit, for example, enabling the signals emitted by the plurality of piezoelectric units to be interfered, etc., and the synthesized ultrasonic signal can obtain a maximum amplitude at a specific position, thereby improving the strength of the signal, improving the resolution of the piezoelectric sensor, obtaining an effect similar to converging the ultrasonic signal along a specific direction, and further increasing the area of the monitoring region. For example, when the piezoelectric sensor mentioned above is used for fingerprint recognition of an electronic device, the piezoelectric sensor can only be arranged in a part of an region below the display screen, which can realize fingerprint recognition on the whole display screen, reduce the occupied area of the piezoelectric sensor and improve the efficiency of human-computer interaction. Moreover, by controlling the ultrasonic signal sent by each piezoelectric unit independently, the position of the maximum amplitude can be changed, that is, scanning signal sensing can be realized.

Because it is required that electrodes are set on both sides of the piezoelectric units, in the case where the piezoelectric layer includes a plurality of piezoelectric units arranged at intervals, the gaps between the piezoelectric units need to be filled with the insulating layer to ensure that the electrode structures on both sides of the piezoelectric units can obtain sufficient mechanical support. The inventor found that the insulating layer 20 can further isolate the adjacent piezoelectric units when transmitting/receiving signals, thereby reducing the electrical coupling between the adjacent piezoelectric units when transmitting/receiving signals, that is, reducing the signal crosstalk of the piezoelectric layer when transmitting/receiving signals, and improving the resolution of the piezoelectric sensor. Those skilled in the art should understand that in order to ensure that the piezoelectric unit can produce the aforementioned positive piezoelectric or inverse piezoelectric effect, it is necessary to select a solid insulating layer or viscoelastic adhesive with Young's modulus smaller than that of the material of the piezoelectric unit.

According to at least one embodiment of the present disclosure, the specific type of the substrate 100 is not particularly limited, for example, the substrate 100 may be formed of an insulating material, such as epoxy resin, etc. Specifically, referring to FIG. 3A-FIG. 3B, the substrate 100 may include a protection sublayer 110 and an acoustic wave reflection sublayer 120 which are opposite to each other, the acoustic wave reflection sublayer 120 may be disposed toward the piezoelectric structure 200. Specifically, the protective sublayer 110 may be formed of an insulating material, such as epoxy resin. Specifically, the acoustic wave reflection sublayer 120 can reflect the ultrasonic wave signal transmitted to one side of the substrate 100 to the other side, thereby reducing signal attenuation and further improving signal strength and sensitivity. Specifically, the acoustic wave reflection sublayer 120 may be made of metal, for example, the material of the acoustic wave reflection sublayer 120 may include copper; specifically, the thickness of the acoustic wave reflection sublayer 120 may be in a range of 10 µm-100 µm, for example, 20 µm, 50 µm, 80 µm. Therefore, in the case where the thickness of the acoustic wave reflection sublayer 120 is within the range of 10 µm-100 µm, the ultrasonic wave signal transmitted to the side of the substrate 100 can be well reflected.

According to at least one embodiment of the present disclosure, the piezoelectric structure 200 includes a first electrode layer 210, a second electrode layer 220, and a piezoelectric layer 230. Specifically, a good electrical connection can be formed between the first electrode layer 210 and the piezoelectric layer 230, and between the second electrode layer 220 and the piezoelectric layer 230. Specifically, in a signal transmission stage, an AC voltage is applied to the piezoelectric layer 230 through the first electrode layer 210 and the second electrode layer 220, for example, a short-time sinusoidal or a square wave signal or a sawtooth wave signal of ±50V and 10 MHz-20 MHz is applied, and the piezoelectric layer 230 is driven by the voltage signal to emit ultrasonic waves; in a signal receiving stage, the reflected ultrasonic wave is transmitted to the piezoelectric layer 230, and the acoustic pressure is converted into an electrical signal by the piezoelectric layer 230, and electrical signal is transmitted to a receiving electrode (for example, on the second electrode layer 220).

According to at least one embodiment of the present disclosure, at least one selected from a group consisting of the first electrode layer 210 and the second electrode layer 220 includes a plurality of sub-electrodes corresponding to the piezoelectric units 10. Specifically, referring to FIG. 1A, the first electrode layer 210 is an electrode formed by a whole layer, that is, the first electrode layer 210 is integral, and the second electrode layer 220 includes a plurality of sub-electrodes 221 corresponding to the piezoelectric units 10, or referring to FIG. 1B, the second electrode layer 220 includes a plurality of sub-electrodes 221 corresponding to the piezoelectric units 10, the first electrode layer 210 includes a plurality of sub-electrodes 211 corresponding to the piezoelectric units 10, or as shown in FIG. 1C, the first electrode layer 210 includes a plurality of sub-electrodes 221 corresponding to the piezoelectric units 10, and the second electrode layer 220 is an electrode formed by a whole layer, that is, the second electrode layer 220 is integral. A material of the first electrode layer 210 is not particularly limited, and may include silver, for example; specifically, the thickness of the first electrode layer 210 may be in a range of 6 µm-12 µm, for example, 8 µm, 10 µm, etc., thereby further improving the usability of the piezoelectric sensor. Those skilled in the art can understand that at least one selected from the group consisting of the first electrode layer 210 and the second electrode layer 220 includes a plurality of sub-electrodes, in order to apply individually controllable voltage signals to the plurality of piezoelectric units. Therefore, it is only required that at least one selected from the group consisting of the first electrode layer 210 and the second electrode layer 220 has a plurality of independent sub-electrodes.

Hereinafter, the embodiments of the present disclosure are described by taking the case that the first electrode layer 210 is an integral electrode and the second electrode layer 220 includes a plurality of sub-electrodes 221 as an example, but it should be understood that the embodiments of the present disclosure are not limited thereto.

Figure 3A:
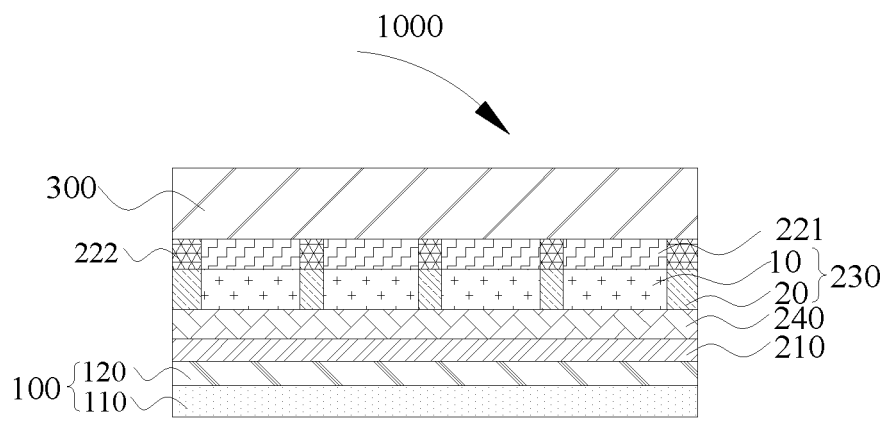
FIG. 3A shows a cross-sectional structural schematic diagram of another piezoelectric sensor provided by at least one embodiment of the present disclosure.

According to at least one embodiment of the present disclosure, referring to FIG. 3A, the piezoelectric sensor 1000 further includes an auxiliary layer 240, which is disposed between the first electrode layer 210 and the piezoelectric layer 230, so that the auxiliary layer 240 can not only enhance adhesion between the first electrode layer 210 and the piezoelectric layer 230, but also prevent metal atoms (such as Ag, Cu, etc.) in the first electrode layer 210 and the acoustic wave reflection sublayer 120 from diffusing into the piezoelectric unit 10, thereby affecting the performance of the piezoelectric unit 10, etc., and improving the breakdown voltage off the piezoelectric structure 200. Specifically, the material forming the auxiliary layer 240 may include molybdenum, chromium, platinum, etc. The thickness of the auxiliary layer 240 may be 50 nm-100 nm, etc., and the total thickness of the auxiliary layer 240 and the first electrode layer 210 may be about 10 μm. According to at least one embodiment of the present disclosure, in the case where the first electrode layer 210 has a whole layer structure, the auxiliary layer 240 may also have a whole layer structure. In the case where the first electrode layer 210 includes a plurality of sub-electrodes, that is, the first electrode layer 210 has a patterned structure, the auxiliary layer 240 may also have the same patterned structure as the first electrode layer 210. Specifically, in the process of manufacturing the piezoelectric sensor, the first electrode layer 210 and the auxiliary layer 240 in a whole layer structure which are stacked can be formed first, and then the first electrode layer 210 and the auxiliary layer 240 can be patterned at the same time by a one-time patterning process to form a structure with a plurality of sub-electrodes arranged at intervals.

Figure 3B:
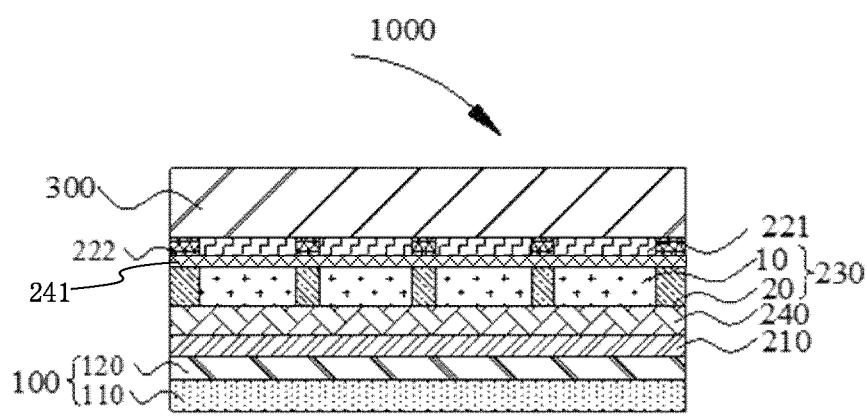
FIG. 3B shows a cross-sectional structural schematic diagram of another piezoelectric sensor provided by at least one embodiment of the present disclosure.

In at least one embodiment of the present disclosure, referring to FIG. 3B, the piezoelectric sensor 1000 further includes an auxiliary layer 241, which is disposed between the second electrode layer 220 and the piezoelectric layer 230. The auxiliary layer 241 can not only enhance adhesion between the second electrode layer 220 and the piezoelectric layer 230, but also prevent metal atoms (such as Ag, Cu, etc.) in the second electrode layer 220 from diffusing into the piezoelectric unit 10 in the case where the second electrode layer 220 is formed of metal, thereby affecting the performance of the piezoelectric unit 10, etc., and improving the breakdown voltage off the piezoelectric structure 200. For example, the material forming the auxiliary layer 241 may include molybdenum, chromium, platinum, etc., and the thickness of the auxiliary layer 241 may be 50 nm-100 nm, etc. According to at least one embodiment of the present disclosure, in the case where the second electrode layer 220 has a whole layer structure, the auxiliary layer 241 may also have a whole layer structure. In the case where the second electrode layer 220 includes a plurality of sub-electrodes, that is, the second electrode layer 220 has a patterned structure, the auxiliary layer 241 may also have the same patterned structure as the second electrode layer 220. Specifically, in the process of manufacturing the piezoelectric sensor, the second electrode layer 220 and the auxiliary layer 241 in a whole layer structure which are stacked can be formed first, and then the second electrode layer 220 and the auxiliary layer 241 can be patterned at the same time by a one-time patterning process to form a structure with a plurality of sub-electrodes arranged at intervals.

According to at least one embodiment of the present disclosure, the second electrode layer 220 may include a plurality of sub-electrodes 221, which may be arranged in one-to-one correspondence with the plurality of piezoelectric units 10, and the number of the sub-electrodes 221 may be equal to the number of the piezoelectric units 10. Specifically, the material forming the sub-electrode 221 is not particularly limited, and may include indium tin oxide (ITO) or the like, for example. Specifically, there are gaps between the plurality of sub-electrodes 221, where an insulating structure can be formed. Referring to the insulating structure 222 shown in FIG. 2, the insulating structure 222 is made of silicon dioxide (SiO2), silicon nitride (SiNx), polyimide (PI), epoxy resin, etc.

According to at least one embodiment of the present disclosure, referring to FIG. 1A, FIG. 1B, FIG. 1C and FIG. 2, for example, the piezoelectric layer 230 includes a plurality of piezoelectric units 10 arranged in an array. Therefore, the performance of the piezoelectric sensor can be further improved. Specifically, the piezoelectric unit 10 may be made of a piezoelectric material, for example, the material of the piezoelectric unit 10 includes at least one selected from a group consisting of polyvinylidene fluoride (PVDF), piezoelectric ceramic transducer (PZT), aluminum nitride (AlN), and the like. Specifically, the thickness of the piezoelectric unit 10 may be in a range of 5 μm-50 μm, for example, 10 μm, 20 μm, 30 μm, 40 μm, etc. In the case where the thickness of the piezoelectric unit 10 is within the range of 5 μm-50 μm, ultrasonic signals can be well transmitted and received.

According to at least one embodiment of the present disclosure, for example, the Young's modulus of the material of the insulation layer 20 is smaller than that of the material of the piezoelectric unit 10. Therefore, the insulation layer 20 is softer than the piezoelectric unit 10, and the pressure acting on the piezoelectric layer 230 for generating a positive piezoelectric effect (i.e., the piezoelectric material generates electric charge under the action of the pressure) can be concentrated on the piezoelectric unit 10, which can improve a sound pressure sensed by a single piezoelectric unit 10, thereby improving the strength of the signals, and does not affect the piezoelectric characteristics of the piezoelectric unit 10, such as piezoelectric coefficient $D_{33}$, dielectric constant, etc. Furthermore, the insulation layer 20 can further divide the plurality of piezoelectric units 10, thereby reducing signal crosstalk and energy loss caused by electrical coupling and mechanical vibration coupling between adjacent piezoelectric units 10, and further improving the resolution and sensitivity of the piezoelectric sensor 1000.

Figure 4:
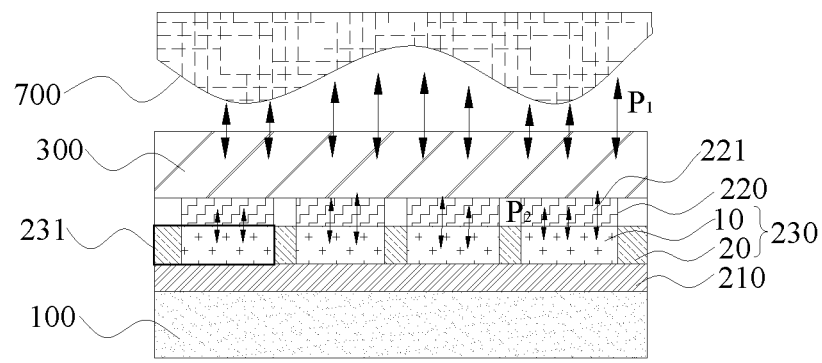
FIG. 4 shows a schematic diagram of the principle of performing fingerprint recognition using a piezoelectric sensor according to at least one embodiment of the present disclosure.

Specifically, referring to FIG. 1A, FIG. 1B, FIG. 1C and FIG. 2, for example, the piezoelectric layer 230 includes an array of piezoelectric units 10 in M rows and N columns, and for example, the size of each piezoelectric unit 10 is a×a (the size of each of the sub-electrodes 221 in one-to-one correspondence with the piezoelectric units 10 is also a×a), a distance between two adjacent piezoelectric units 10 in each row is b, and a distance between two adjacent rows of piezoelectric units 10 is b. When the piezoelectric sensor 1000 senses, the piezoelectric layer 230 receives ultrasonic wave signals reflected by the object to be detected. Because the surface topography of the object to be detected (e.g., a finger) in contact with the contact layer 300 is various, for example, referring to FIG. 4, the fingerprints on the finger 700 includes peaks and valleys arranged at intervals, so ultrasonic wave signals received at different positions of the piezoelectric layer 230 are also different. For each subunit 231 formed by a piezoelectric unit 10 and the insulation layer 20 surrounding the piezoelectric unit 10 (refer to the subunit 231 marked by the bold solid frame in FIG. 4), a pressure generated by the reflected ultrasonic wave signal received by the subunit 231 is $F_1$, and an area of the subunit 231 is $S_1=(a+b)^2$. In the case where the insulation layer 20 in the subunit 231 is made of a material with a larger Young's modulus (harder), the pressure $F_1$ acts on the whole subunit 231, and the pressure generated on the subunit 231 is $P_1=F_1/S_1$. In the piezoelectric sensor 1000 according to at least one embodiment of the present disclosure, the insulation layer 20 is made of a soft material (the Young's modulus of the material of the insulation layer is smaller than that of the material of the piezoelectric unit), therefore the pressure generated by the reflected ultrasonic wave signal received by the subunit 231 is $F_1$, and almost all of the pressure $F_1$ is applied to the piezoelectric unit 10 with an area of $S_2=a^2$, therefore the pressure generated on the piezoelectric unit 10 is $P_2=F_1/S_2$, and $P_2$ is greater than $P_1$. Therefore, the acoustic pressure received by the piezoelectric unit 10 (i.e., the pressure generated by reflected ultrasonic waves) is amplified. Therefore, the signal strength and detection sensitivity are improved.

According to at least one embodiment of the present disclosure, for example, the Young's modulus of the material of the insulation layer 20 is not greater than 2 GPa, for example, the Young's modulus of the material of the insulation layer 20 is in a range of 1 MPa-2 GPa. Therefore, the performance of the piezoelectric sensor can be further improved. Specifically, the material of the insulation layer 20 may include at least one selected from a group consisting of cured epoxy photosensitive adhesive, liquid optically transparent adhesive, polydimethylsiloxane (PDMS), and the like.

According to at least one embodiments of the present disclosure, the specific type of the contact layer 300 is not particularly limited, and may be, for example, a glass substrate, a display screen, and the like. Specifically, as mentioned above, the Young's modulus of the material of the contact layer 300 may be greater than that of the material of the piezoelectric unit 10, that is, the contact layer 300 may be harder.

Figure 5:
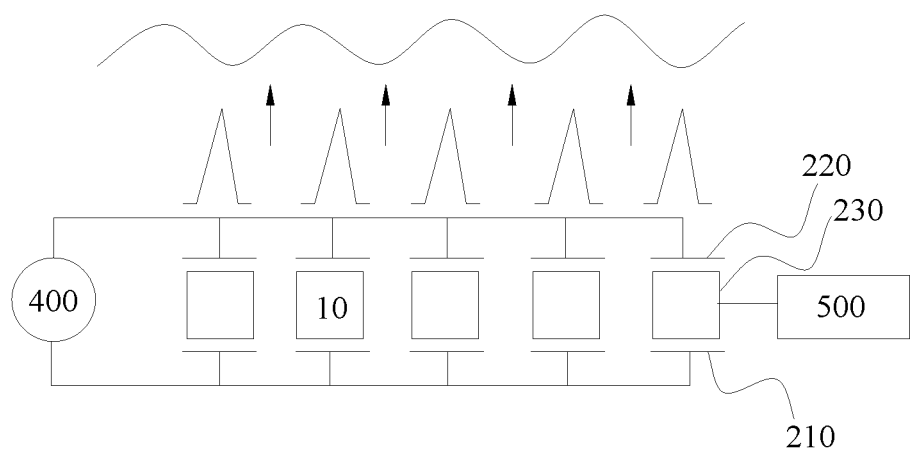
FIG. 5 shows a schematic diagram of the principle of performing sensing using a piezoelectric sensor provided by at least one embodiment of the present disclosure.
Figure 6:
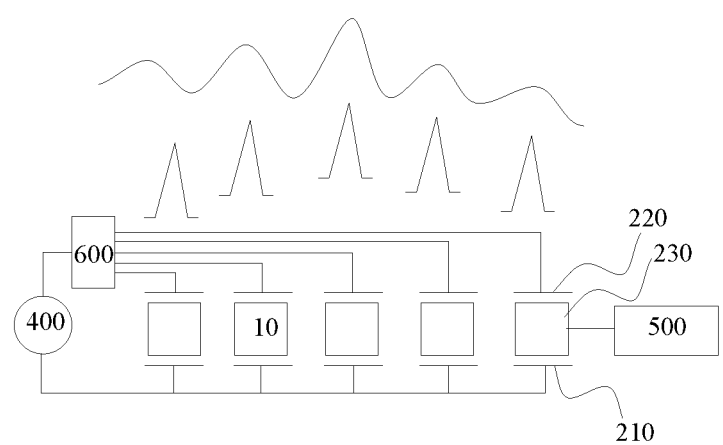
FIG. 6 shows a schematic diagram of the principle of performing sensing using another piezoelectric sensor provided by at least one embodiment of the present disclosure.

According to at least one embodiment of the present disclosure, referring to FIG. 5 and FIG. 6, for example, the piezoelectric sensor 1000 further includes an excitation source 400, the excitation source 400 is electrically connected with the piezoelectric structure to excite the plurality of piezoelectric units 20 to generate ultrasonic waves. Specifically, the excitation source 400 is electrically connected with the first electrode layer 210 and the second electrode layer 220. In the signal transmission stage, the excitation source 400 applies an AC voltage to each piezoelectric unit 10 through the first electrode layer 210 and the second electrode layer 220 (a plurality of sub-electrodes electrically connected with the piezoelectric units 10), for example, applying a short-time sinusoidal or a square wave signal or a sawtooth wave signal of 10 MHz-20 MHz and ±50V, the piezoelectric units 10 are driven by the voltage signal to respectively emit ultrasonic waves, and the ultrasonic waves emitted by the plurality of piezoelectric units 10 can be synthesized into approximate a plane wave after propagating for a certain distance. As mentioned above, because the Young's modulus of the material of the insulation layer 20 between the piezoelectric units 10 is smaller, there is no mechanical coupling loss among the plurality piezoelectric units 10, therefore energy dissipation can be reduced, the strength of the synthesized plane wave finally emitted by the piezoelectric structure is improved, and the signal strength and monitoring sensitivity are improved.

According to at least one embodiment of the present disclosure, referring to FIG. 6, for example, the piezoelectric sensor 1000 further includes a phase controller 600, the phase controller 600 is electrically connected with the piezoelectric structure and independently modulate the phase of a signal used for exciting each piezoelectric unit 10 to generate the ultrasonic waves. Therefore, by the phase controller 600, the ultrasonic wave signals emitted by each piezoelectric unit 10 can be independently controlled (for example, excitation signals with different time delays are applied to different piezoelectric units 10), and the phases of the ultrasonic wave signals emitted by the plurality of piezoelectric units are the same or different (referring to FIG. 6), so that the signals emitted by the whole piezoelectric layer 230 can be focused, directional controlled, etc., thus increasing the area of the monitoring region, that is, sensing and monitoring in a larger area is realized based on a smaller area of the piezoelectric sensor 1000. For example, when the piezoelectric sensor mentioned above is used for fingerprint recognition of an electronic device, the piezoelectric sensor can only be arranged in a part of a region below the display screen, which can realize fingerprint recognition on the whole display screen, reduce the occupied area of the piezoelectric sensor, improve the efficiency of human-computer interaction and further improve the service performance of the piezoelectric sensor.

According to at least one embodiment of the present disclosure, referring to FIG. 5 and FIG. 6, for example, the piezoelectric sensor 1000 further includes a piezoelectric sensing circuit 500, the piezoelectric sensing circuit 500 is electrically connected with the piezoelectric structure. For example, the piezoelectric sensing circuit 500 is in one-to-one correspondence to piezoelectric structure. Therefore, in the signal receiving stage, using the piezoelectric sensing circuit 500, the reflected wave received by the piezoelectric layer 230 can be converted into electrical signals, and the electrical signals can be output to a peripheral signal processor for analyzing and judging the monitoring result of the piezoelectric sensor 1000. Specifically, the piezoelectric sensing circuit 500 can convert the electrical signals converted by the plurality of piezoelectric units 10 from AC signals to DC signals which are respectively stored in the storage capacitor of the piezoelectric sensing circuit 500 and sequentially output to the peripheral signal processor in a signal readout stage.

Figure 7:
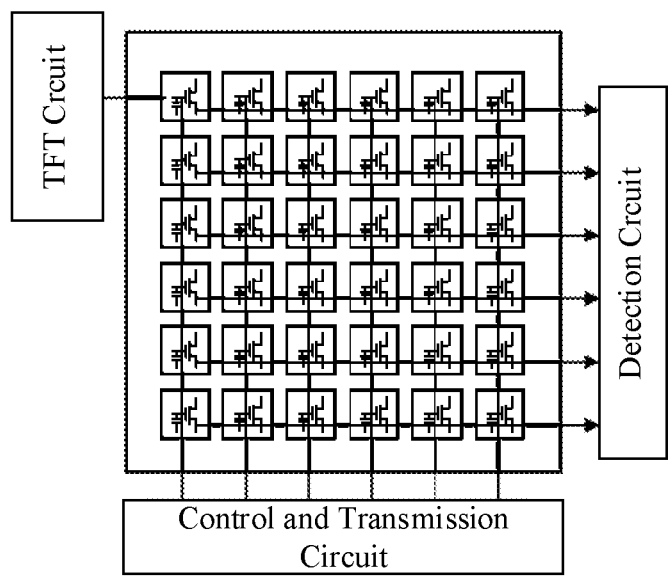
FIG. 7 shows a structural schematic diagram of a part of a circuit of a piezoelectric sensor provided by at least one embodiment of the present disclosure.
Figure 8:
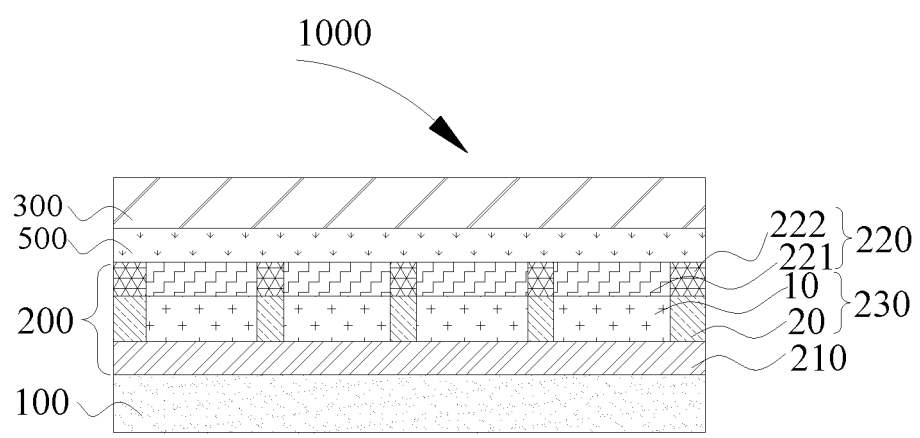
FIG. 8 shows a cross-sectional structural schematic diagram of further another piezoelectric sensor provided by at least one embodiment of the present disclosure.

According to at least one embodiment of the present disclosure, referring to FIG. 7 and FIG. 8, for example, the piezoelectric sensing circuit 500 is disposed on a side of the second electrode layer 220 away from the first electrode layer 210. Specifically, the piezoelectric sensing circuit 500 may include a control and emission circuit, a detection circuit (not illustrated in the figures), a TFT circuit, and the like. The above-mentioned excitation source and the phase sensor can control the AC voltage applied between the first electrode layer and the second electrode layer through the control and transmission circuit, and further control the phase of the ultrasonic wave signal transmitted by each piezoelectric unit, so as to adjust the ultrasonic wave signal transmitted by the whole piezoelectric structure as required. The detection circuit, TFT circuit, and the like can output the electric signals generated by the reflected waves received by each piezoelectric unit to the peripheral signal processor in a certain order.

Figure 9:
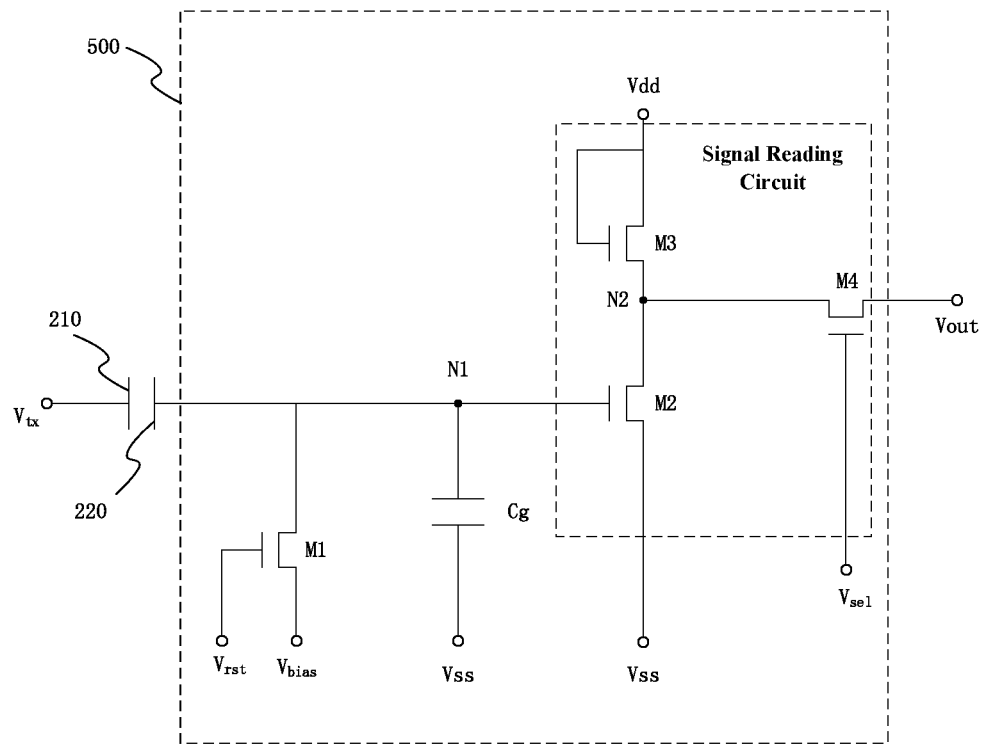
FIG. 9 is a structural schematic diagram of a piezoelectric sensing circuit provided by at least one embodiment of the present disclosure.

FIG. 9 is a schematic structural diagram of a piezoelectric sensing circuit 500 provided by at least one embodiment of the present disclosure. As illustrated in FIG. 9, the piezoelectric sensing circuit 500 includes a storage capacitor Cg, a first transistor M1 and a signal reading circuit. A control electrode of the first transistor M1 is configured to receive a sampling control signal Vrst, and a first electrode of the first transistor M1 is configured to receive a bias signal Vbias.

The second electrode layer 220, a second electrode of the first transistor M1, a first terminal of the storage capacitor Cg and a first terminal of the signal reading circuit are connected to a first node N1. A second terminal of the storage capacitor Cg is connected to a first power supply voltage Vss. The signal reading unit is configured to read the electrical signal stored in the storage capacitor Cg, that is, the voltage signal received by the second electrode layer 220.

For example, in at least one embodiment of the present disclosure, the signal reading circuit includes a second transistor M2, a third transistor M3, and a fourth transistor M4. A control electrode of the second transistor M2 serves as the first terminal of the signal reading circuit, a second electrode of the second transistor M2 is connected to the first power supply voltage Vss, and a first electrode of the second transistor M2, a second electrode of the third transistor M3 and a first electrode of the fourth transistor M4 are connected to a second node N2. A control electrode of the third transistor M3 and a first electrode of the third transistor M3 are configured to receive a second power supply voltage Vdd. A second electrode of the fourth transistor M4 serves as a signal output terminal Vout of the signal reading circuit, and a control electrode of the fourth transistor M4 is configured to receive an output control signal Vsel. The second power supply voltage Vdd is higher than the first power supply voltage Vss, for example, the first power supply voltage Vss is a low voltage, such as ground, and the second power supply voltage is a constant high voltage.

It should be understood that only one exemplary structure of the signal reading circuit is illustrated in FIG. 9, and in other embodiments, the signal reading circuit may have other structures, as long as the signal reading circuit can read the electrical signal stored in the storage capacitor Cg, the embodiments of the present disclosure does not impose limitation to this.

Transistors adopted in embodiments of the present disclosure may be thin film transistors, field effect transistors or other switch devices with the same characteristics. The source electrode and drain electrode of the transistor adopted here may be symmetrical in structure, therefore there can be no difference in structure between the source electrode and drain electrode of the transistor. For example, the above-mentioned transistors are all N-type transistors, and for example, the first electrode is the drain electrode and the second electrode is the source electrode.

To sum up, according to the piezoelectric sensor of at least one embodiment of the present disclosure, by arranging the plurality of piezoelectric units arranged at intervals, the piezoelectric units arranged at intervals can independently transmit/receive signals, which reduces the electrical coupling of the piezoelectric structure when transmitting/receiving signals, reduces signal crosstalk, and can focus and control the direction of ultrasonic wave signals emitted by the whole piezoelectric structure, and in this way, the signal strength and resolution are further improved, the area of the monitoring region is increased, the occupied area of the piezoelectric sensor is reduced, and the human-computer interaction efficiency is improved.

In another aspect of the present disclosure, the present disclosure proposes a method for fingerprint recognition. According to at least one embodiment of the present disclosure, the method can adopt any one of the above-mentioned piezoelectric sensors to realize the fingerprint recognition, therefore the method has all the features and advantages of the above-mentioned piezoelectric sensors which are not be described in detail here.

Figure 10:
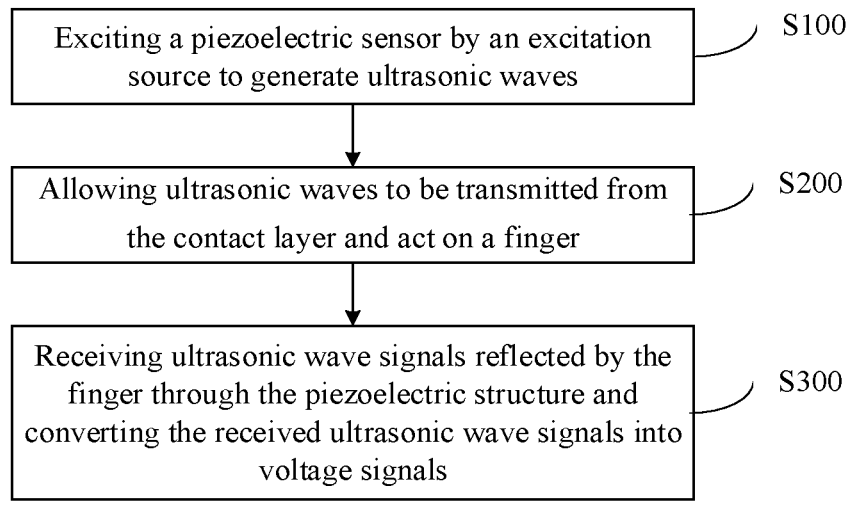
FIG. 10 shows a flowchart of a method for fingerprint recognition according to at least one embodiment of the present disclosure.

According to at least one embodiment of the present disclosure, referring to FIG. 10, the method includes the following steps.

S100: exciting a piezoelectric sensor by an excitation source to generate ultrasonic waves.

In this step, the piezoelectric sensor is excited by the excitation source to generate the ultrasonic waves. According to at least one embodiment of the present disclosure, the piezoelectric sensor has the same structure as any one of the piezoelectric sensors described above, for example, the piezoelectric sensor includes a first electrode layer and a second electrode layer which are opposite to each other, and a piezoelectric layer. The piezoelectric layer is located between the first electrode layer and the second electrode layer and includes a plurality of piezoelectric units arranged at intervals and an insulation layer between adjacent piezoelectric units. At least one selected from a group consisting of the first electrode layer and the second electrode layer includes a plurality of sub-electrodes corresponding to the piezoelectric units. Specifically, in this step, the excitation source can be electrically connected with the first electrode layer and the second electrode layer, and the excitation source can apply an AC voltage to each piezoelectric unit through the first electrode layer and the second electrode layer (a plurality of sub-electrodes electrically connected with the piezoelectric units), for example, a short-time sinusoidal or a square wave or a sawtooth wave signal of 10 MHz-20 MHz and ±50V are applied, and the piezoelectric unit is driven by the voltage signal to emit the ultrasonic waves respectively, and the ultrasonic waves emitted by the plurality of piezoelectric units can be synthesized into approximate a plane wave after propagating for a certain distance.

According to at least one embodiment of the present disclosure, the piezoelectric sensor may further include a phase controller, the phase controller is electrically connected with the piezoelectric structure, and the phase of a signal used for exciting each piezoelectric unit to generate ultrasonic waves may be independently modulated by the phase controller. Therefore, the phase controller can independently regulate and control the signals emitted by each piezoelectric unit, which is beneficial to focusing and direction control of the signals emitted by the whole piezoelectric structure, and further improves the resolution of fingerprint recognition realized by this method.

According to some embodiments of the present disclosure, independently modulating the phase of the signal used for exciting each piezoelectric unit to generate ultrasonic waves may include adjusting the phases of signals applied to the plurality of piezoelectric units so that the ultrasonic waves generated by the plurality of piezoelectric units have the maximum amplitude at a set position. For example, the phases of the signals applied to the piezoelectric units are adjusted to shift the phases of the excitation signals applied to the piezoelectric units, so that the ultrasonic wave signals generated by the piezoelectric units can be superimposed during propagation, and the synthesized ultrasonic wave signal has the maximum amplitude. Therefore, the ultrasonic wave signals generated by the plurality of piezoelectric units can be "focused", the signal strength of the ultrasonic waves finally emitted by the piezoelectric structure can be improved, more fingerprint detection information in the depth direction can be obtained by the concentration of ultrasonic energy, and the sensitivity and resolution of fingerprint recognition realized by this method can be further improved.

According to other embodiments of the present disclosure, independently modulating the phase of the signal used for exciting each piezoelectric unit to generate ultrasonic waves may further include: changing the direction of the maximum amplitude formed previously by adjusting the phases of the signals applied to the plurality of piezoelectric units, that is, changing the magnitude and timing of the phases of the excitation signals of piezoelectric units at different spatial positions, so that the direction of the maximum amplitude can be changed along a predetermined route. Therefore, the acoustic wave emitted by the piezoelectric structure can be focused according to a predetermined route, that is, the direction of the finally generated ultrasonic wave signal can be changed, so that fingerprint monitoring in a larger area can be realized under a smaller area of the piezoelectric sensor, and the human-computer interaction efficiency is improved. By changing the magnitude and timing of the phase shift of the excitation signals of the sensor units in different spatial positions, the focusing and direction scanning of ultrasonic waves can be realized, and more detection information in the depth direction can be obtained by concentration of ultrasonic energy, and fingerprint detection in a larger area can be realized based on a smaller area of the sensor array.

S200: allowing ultrasonic waves to be transmitted from the contact layer and act on a finger.

In this step, the ultrasonic wave generated in the previous step is transmitted from the contact layer and acts on the finger. According to at least one embodiment of the present disclosure, in this process, the finger is in contact with the contact layer, and then the ultrasonic wave generated in the previous step can be transmitted by the contact layer and acted on the finger, and the finger can reflect the received ultrasonic wave signal back to the contact layer. Because the fingerprint of finger has peaks and valleys spaced apart with each other, the reflection of ultrasonic waves at the peaks are different from the reflection of ultrasonic waves at the valleys of finger, therefore the ultrasonic wave signals reflected back to the contact layer are also different after being acted by the finger.

S300: receiving ultrasonic wave signals reflected by the finger through the piezoelectric structure and converting the received ultrasonic wave signals into voltage signals.

In this step, the piezoelectric structure receives the ultrasonic wave signal reflected by the finger in the previous step and converts it into a voltage signal, thus realizing fingerprint recognition. According to at least one the embodiment of the present disclosure, in the piezoelectric sensor, the Young's modulus of the material of the insulation layer is smaller than that of the material of the piezoelectric unit. Therefore, as mentioned above, because the surface topography of the object to be detected (e.g., a finger) in contact with the contact layer 300 is various, and the fingerprint on the finger has peaks and valleys arranged at intervals, the ultrasonic wave signals received at different positions of the piezoelectric structure are also different. For each subunit formed by the piezoelectric unit and the insulation layer surrounding the piezoelectric unit, the pressure generated by the reflected ultrasonic signal received by the subunit is $F_1$, and the area of the subunit 231 is $S_1=(a+b)^2$. In the case where the insulation layer in the subunit 231 is made of a material with larger Young's modulus (harder), the pressure $F_1$ acts on the whole subunit 231, and the pressure generated on the subunit 231 is $P_1=F_1/S_1$. In the piezoelectric sensor 1000 according to at least one embodiment of the present disclosure, the insulation layer 20 is made of a soft material (the Young's modulus of the material of the insulation layer is smaller than that of the material of the piezoelectric unit), therefore the pressure generated by the reflected ultrasonic wave signal received by the subunit 231 is $F_1$, and almost all of the pressure $F_1$ is applied to the piezoelectric unit with an area of $S_2=a^2$, so the pressure generated on the piezoelectric unit 10 is $P_2=F_1/S_2$, and $P_2$ is greater than $P_1$. Therefore, the acoustic pressure received by the piezoelectric unit 10 (i.e., the pressure generated by reflected ultrasonic waves) is amplified. Therefore, the signal strength and detection sensitivity are improved.

Figure 11:
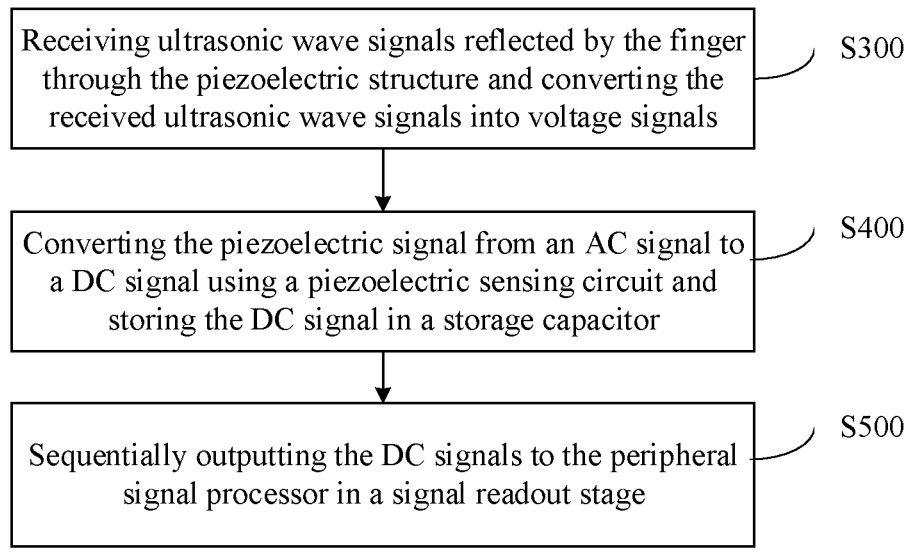
FIG. 11 shows a flowchart of another method for fingerprint recognition according to at least one embodiment of the present disclosure.

According to at least one embodiment of the present disclosure, referring to FIG. 11, the method further includes the following steps.

S400: converting the piezoelectric signal from an AC signal to a DC signal using a piezoelectric sensing circuit and storing the DC signal in a storage capacitor.

In this step, the piezoelectric signal is converted from an AC signal to a DC signal using the piezoelectric sensing circuit and is stored in a storage capacitor. According to at least one embodiment of the disclosure, the piezoelectric sensor further includes a piezoelectric sensing circuit electrically connected with the piezoelectric structure, and the piezoelectric signals converted by the plurality piezoelectric units can be converted from AC signals to DC signals by using the piezoelectric sensing circuit, and respectively stored in the storage capacitor of the piezoelectric sensing circuit.

S500: sequentially outputting the DC signals to the peripheral signal processor in a signal readout stage.

In this step, in the signal readout stage, the DC signals stored in the piezoelectric sensing circuit in the previous step are sequentially output to the peripheral signal processor. Therefore, the signal of the piezoelectric structure can be conveniently transmitted to the peripheral signal processor, so that the signal fed back by the piezoelectric structure can be processed to obtain fingerprint recognition information.

Figure 12:
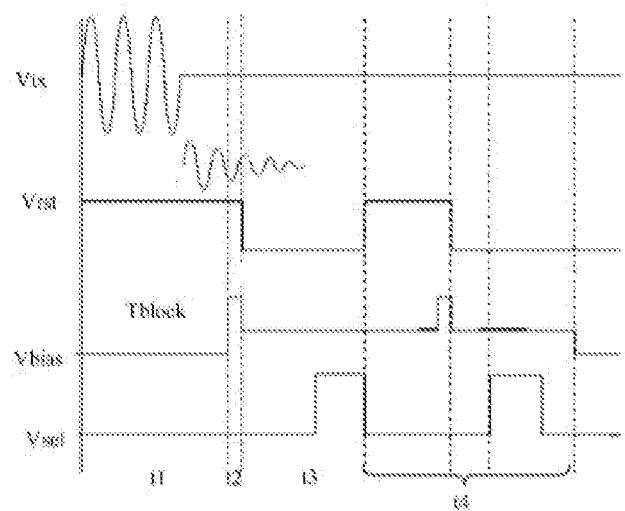
FIG. 12 is a timing diagram of a piezoelectric sensing circuit provided by at least one embodiment of the present disclosure.

FIG. 12 is a timing diagram of a piezoelectric sensing circuit provided by at least one embodiment of the present disclosure, for example, the piezoelectric sensing circuit is the piezoelectric sensing circuit illustrated in FIG. 9. Taking the case that each transistor is an N-type transistor as an example, referring to the timing diagram of the piezoelectric sensing circuit illustrated in FIG. 12, the working process of the piezoelectric sensing circuit is as follows.

At stage t1, the first electrode layer 210 receives an excitation signal Vtx, and under the action of the excitation signal Vtx, the sensing unit emits ultrasonic waves. The sampling control signal Vrst is at a high level, and the first transistor M1 is turned on; the bias signal Vbias is at a low level, the second transistor M2 is turned off by the bias signal Vbias, and the signal output terminal Vout does not output signals.

At stage t2, the sampling control signal Vrst is at a high level, and the first transistor M1 is turned on; the bias signal Vbias is at a high level, the fingerprint signal received on the receiving electrode is written into the storage capacitor Cg, the output control signal Vsel is at a low level, the fourth transistor M4 is turned off, and the signal output terminal Vout does not output signals. The length of t2 is, for example, a quarter of the transmission wave period, a half of the transmission wave period, or other lengths.

At stage t3, the control signal Vrst is at a low level, the first transistor M1 is turned off, the second transistor M2 is turned on under the drive of the signal in the storage capacitor Cg, and the output control signal Vsel is switched to a high level. At this time, the signal of the control electrode of the second transistor M2 is transmitted to the signal output terminal Vout, that is, the fingerprint signal is output after being amplified.

At stage t4: t4 stage is the signal acquisition process of other line scanning stages, that is, when other lines are scanned, the ultrasonic waves of other lines are reflected to the current line and received by a pixel receiving circuit of the current line.

To sum up, the above method can transmit/receive signals independently by using the plurality of piezoelectric units arranged at intervals. By independently adjusting the signal transmission situation of each piezoelectric unit, it can focus and control the direction of ultrasonic wave signals emitted by the whole piezoelectric structure, increase the area of monitoring area and reduce the occupied area of piezoelectric sensors. Moreover, the plurality of piezoelectric units can improve the signal strength and resolution by forming transmission signals with maximum amplitude.

Figure 13:
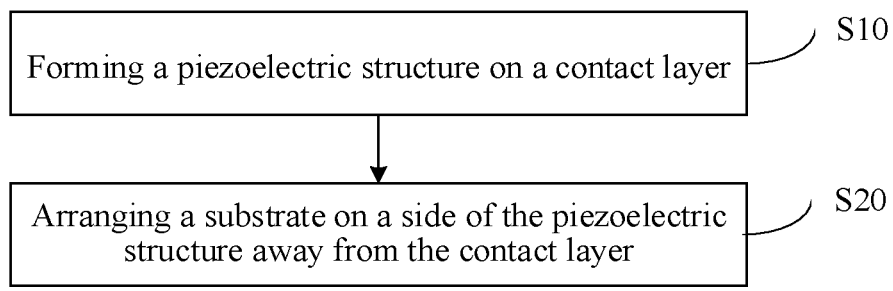
FIG. 13 shows a flowchart of a method for manufacturing a piezoelectric sensor provided by at least one embodiment of the present disclosure.

In yet another aspect of the present disclosure, the present disclosure provides a method for manufacturing the piezoelectric sensor described above. Therefore, the piezoelectric sensor prepared by this method has all the characteristics and advantages of the piezoelectric sensor described above which are not described in detail here. According to at least one embodiment of the present disclosure, referring to FIG. 13, the method includes the following steps.

S10: forming a piezoelectric structure on a contact layer.

Figure 14:
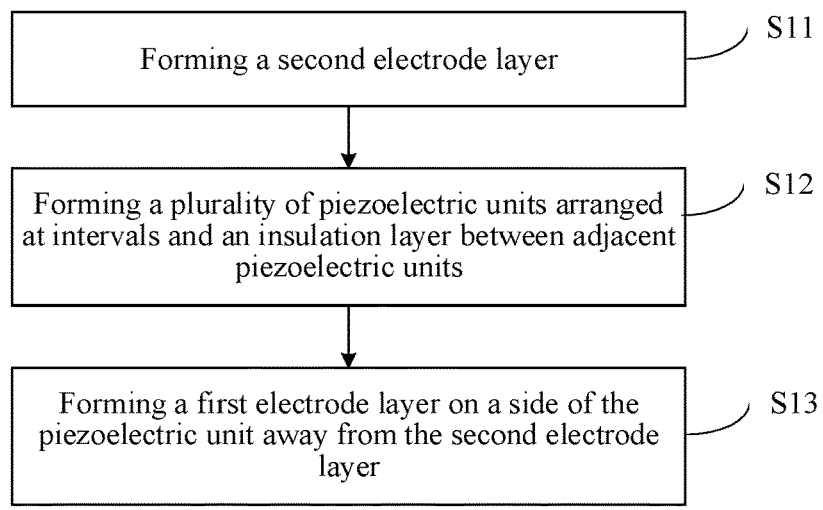
FIG. 14 shows a flowchart of another method for manufacturing a piezoelectric sensor provided by at least one embodiment of the present disclosure.

In the step, the piezoelectric structure is formed on the contact layer. According to the embodiments of the present disclosure, the contact layer may be a glass substrate or the like. According to at least one embodiment of the present disclosure, referring to FIG. 14, step S10 may include the following S11-S13.

S11: forming a second electrode layer.

In the step S11, for example, a second electrode layer is formed on a base substrate. According to the embodiments of the present disclosure, in the case where the base substrate is a glass substrate, for example, the second electrode layer is formed on a side of the glass substrate, and the second electrode layer includes a plurality of sub-electrodes, and an insulation structure is provided between adjacent sub-electrodes of the plurality of sub-electrodes. Specifically, as mentioned above, the material for forming the second electrode layer may include indium tin oxide (ITO), etc., and the material for forming the insulation structure may include at least one selected from a group consisting of silicon dioxide ($SiO_2$), silicon nitride ($SiN_x$), polyimide (PI), epoxy resin, etc.

According to at least one embodiment of the present disclosure, in the step S11, a second electrode layer and a piezoelectric sensing circuit may be formed on the base substrate, specifically, for example, the piezoelectric sensing circuit is formed on the base substrate first, and then the second electrode layer is formed.

S12: forming a plurality of piezoelectric units arranged at intervals and an insulation layer between adjacent piezoelectric units.

In the step S12, the plurality of piezoelectric units arranged at intervals and the insulation layer between adjacent piezoelectric units are formed on the side, away from the base substrate, of the second electrode layer formed in the previous step. According to at least one embodiment of the present disclosure, in the step S12, a polyvinylidene fluoride film is spin-coated on a side, away from the glass substrate, of the plurality of sub-electrodes formed in the previous step, and the plurality of piezoelectric units arranged in an array are formed using the polyvinylidene fluoride film, and the insulation layer is formed at the gaps between adjacent piezoelectric units. Specifically, the spin-coated polyvinylidene fluoride film can be dried and then etched to form the plurality of independent piezoelectric units, and then a material for forming the insulation layer, such as epoxy resin or polyimide, is filled between adjacent piezoelectric units, and then the piezoelectric units are polarized by a polarization process to enable the piezoelectric units to possess piezoelectric characteristics. Specifically, the material for forming the piezoelectric unit may include at least one selected from a group consisting of polyvinylidene fluoride (PVDF), PZT, AlN, and the like. Specifically, the thickness of the piezoelectric unit may be in a range of 5 µm-50 µm, such as 10 µm, 20 µm, 30 µm, 40 µm, etc. In the case where the thickness of the piezoelectric unit 10 is within the range of 5 µm-50 µm, ultrasonic wave signals can be well transmitted and received. It should be noted that because the polarization process has been performed on the formed piezoelectric unit in the previous step, the operation temperature should not be higher than 120° C. in the subsequent preparation process, so as to avoid the influence of the subsequent preparation process on the service performance of the piezoelectric unit.

Specifically, as mentioned above, for example, the Young's modulus of the material for forming the insulation layer is smaller than that of the material for forming the piezoelectric unit. For example, the Young's modulus of the material for forming the insulation layer is not greater than 2 GPa, for example, the Young's modulus of the material for forming the insulation layer is in a range of 1 MPa-2 GPa. Therefore, the performance of the piezoelectric sensor can be further improved. Specifically, the material for forming the insulation layer may include at least one selected from a group consisting of cured epoxy photosensitive adhesive, liquid optically transparent adhesive, polydimethylsiloxane (PDMS), and the like. Therefore, the service performance of the prepared piezoelectric sensor can be further improved.

S13: forming a first electrode layer on a side of the piezoelectric unit away from the second electrode layer.

In the step S13, the first electrode layer is formed on a side, away from the second electrode layer, of the piezoelectric unit formed in the previous step, thus the piezoelectric structure is formed. According to at least one embodiment of the present disclosure, as mentioned above, the first electrode layer may be an integral electrode on a whole layer, and the material for forming the first electrode layer is not particularly limited, for example, it may include silver; specifically, the thickness of the first electrode layer 210 may be in a range of 6 µm-12 µm, for example, 8 µm, 10 µm, etc., thereby further improving the performance of the prepared piezoelectric sensor. According to the embodiments of the present disclosure, as mentioned above, in order to avoid the metal in the formed first electrode layer diffusing into the piezoelectric layer and affecting the performance of the piezoelectric unit, an auxiliary layer may be arranged between the first electrode layer and the piezoelectric layer. Specifically, an auxiliary layer may be formed on a side, away from the second electrode layer, of the piezoelectric unit prepared in the previous step, for example, a metal molybdenum layer or a platinum layer is formed by magnetron sputtering, and then conductive silver electrode is made on a side of the auxiliary layer away from the second electrode layer by sputtering or screen printing.

S20: arranging a substrate on a side of the piezoelectric structure away from the contact layer.

In the step S20, a substrate is provided on a side, away from the contact layer, of the piezoelectric structure formed in the previous step. That is, the substrate is formed on a side of the first electrode layer away from the piezoelectric layer. According to at least one embodiment of the present disclosure, the substrate includes an acoustic wave reflection sublayer and a protection sublayer sequentially formed on the side of the first electrode layer away from the piezoelectric unit. Specifically, as mentioned above, the protection sublayer may be formed of an insulating material, such as epoxy resin. The acoustic wave reflection sublayer may be formed of metal such as copper, and the thickness of the acoustic wave reflection sublayer may be in a range of 10 μm-100 μm. Therefore, the service performance of the prepared piezoelectric sensor can be further improved. Specifically, the acoustic wave reflection sublayer, such as a copper layer, may be fabricated on the side, away from the piezoelectric unit, of the first electrode layer prepared in the previous step by electroplating process. And a layer of epoxy resin is coated on a side of the acoustic wave reflection sublayer away from the first electrode layer to form the protection sublayer. To sum up, this method can simply prepare piezoelectric sensors, and the prepared piezoelectric sensors can independently transmit/receive signals through the plurality of piezoelectric units arranged at intervals, which can improve signal strength and resolution.

In yet another aspect of the present disclosure, at least one embodiment of the present disclosure provides an electronic device. According to at least one embodiment of the present disclosure, the electronic device includes any one of the piezoelectric sensors as described above. Therefore, the electronic device has all the features and advantages of the piezoelectric sensor described above which are not described here again. Generally speaking, the electronic device can realize monitoring in a larger area (such as fingerprint monitoring, etc.) using a small area of the piezoelectric sensor, which improves the efficiency of human-computer interaction, and has high sensitivity and resolution in sensing and monitoring.

Figure 15:
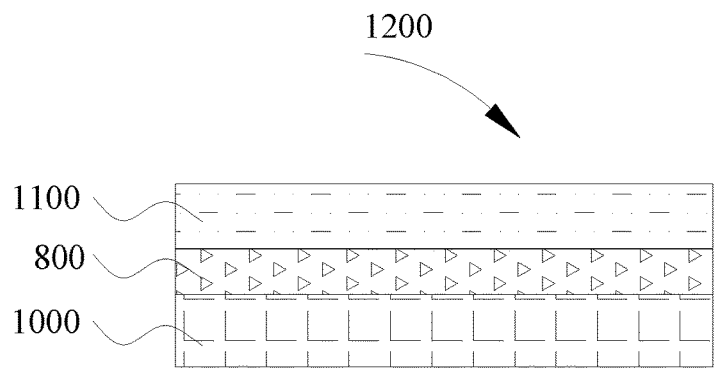
FIG. 15 shows a structural schematic diagram of an electronic device provided by at least one embodiment of the present disclosure.
Figure 16:
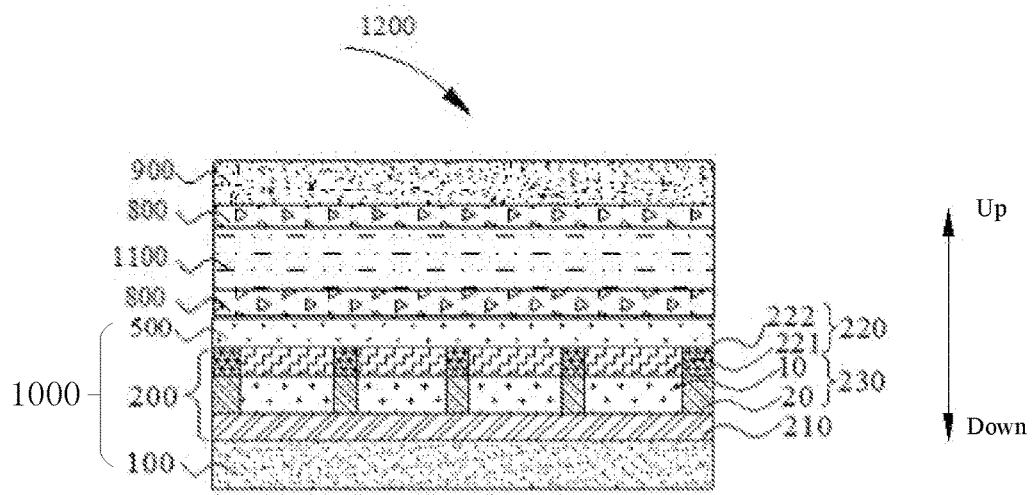
FIG. 16 shows a schematic structural diagram of another electronic device provided by at least one embodiment of the present disclosure.

According to at least one embodiment of the present disclosure, referring to FIG. 15, for example, an electronic device 1200 includes the piezoelectric sensor 1000 described above and a display screen 1100. The piezoelectric sensor 1000 may be disposed on a side of the display screen 1100 away from the light emitting side, and specifically, the piezoelectric sensor 1000 may be fixedly disposed on the side of the display screen 1100 away from the light emitting side through an optical adhesive layer 800. Specifically, the display screen 1100 may be an organic light emitting display (OLED), the OLED can reduce the energy loss and signal interference of ultrasonic wave transmission due to its thin thickness. Therefore, the sensitivity of fingerprint recognition using the piezoelectric sensor described above is high. Specifically, the hardness of the material for forming the optical adhesive layer 800 may be high, for example, the material for forming the optical adhesive layer 800 is OCA adhesive cured by UV; the thickness of the optical adhesive layer 800 may be less than 100 μm. Therefore, the energy loss and signal interference of ultrasonic wave transmission can be further reduced, and the sensitivity of fingerprint recognition using the piezoelectric sensor described above can be further improved. According to at least one embodiment of the present disclosure, referring to FIG. 16, for example, the electronic device further includes a cover plate 900. Specifically, the cover plate 900 may be a glass cover plate which is arranged above the display screen 1100, and the cover plate 900 and the display screen 1100 can also be bonded by the optical adhesive layer 800. Specifically, the thickness of the cover plate 900 may be as thin as possible, for example, is in a range of 50 μm-200 μm, so that the energy loss and signal interference of ultrasonic wave transmission can be further reduced, and the sensitivity of fingerprint recognition using the piezoelectric sensor described above can be improved. It should be understood that although the piezoelectric sensor 1000 in FIG. 16 has the structure as illustrated in FIG. 8, the embodiments of the present disclosure are not limited to this. In other embodiments, the piezoelectric sensor 1000 in the electronic device 1200 may have the structure of any one of the piezoelectric sensors provided by the embodiments of the present disclosure, such as the structure of the piezoelectric sensor provided by any embodiment illustrated in FIG. 1A-FIG. 9 and the structure of a piezoelectric sensor obtained by combining the embodiments illustrated in FIG. 1A-FIG. 9.

In addition, it should be understood that the electronic device 1200 may further include other conventional components, such as a signal processor for processing the electrical signals output by the piezoelectric sensor to recognize fingerprints, and the embodiments of the present disclosure are not limited to this.

The electronic device 1200 may be, for example, an OLED TV, electronic paper, a mobile phone, a tablet computer, a notebook computer, a digital photo frame, a navigator, and the like.

In the description of the present disclosure, the orientation or positional relationship indicated by the terms "upper", "lower", etc. are based on the orientation or positional relationship shown in the drawings, which is only for the convenience of describing the present disclosure and does not require that the present disclosure must be constructed and operated in a specific orientation, and therefore cannot be understood as a limitation to the present disclosure.

In the description of the present disclosure, the description with reference to the terms "one embodiment", "another embodiment", etc. means that the specific features, structures, materials, or characteristics described in conjunction with the embodiment is included in at least one embodiment of the present disclosure. In the present disclosure, the schematic representations of the above-mentioned terms do not necessarily refer to the same embodiment or example. Moreover, the described specific features, structures, materials, or characteristics can be combined in a suitable manner in any one or more embodiments or examples. In addition, those skilled in the art can combine the different embodiments or examples and the features of the different embodiments or examples described in the present disclosure without mutual contradiction. In addition, it should be noted that in the present disclosure, the terms "first" and "second" are only used for descriptive purposes, and cannot be understood as indicating or implying relative importance or implicitly indicating the number of indicated technical features.

What have been described above are only specific implementations of the present disclosure, the protection scope of the present disclosure is not limited thereto. The protection scope of the present disclosure should be based on the protection scope of the claims.

What is claimed is:
1. A piezoelectric sensor, comprising:
a first electrode layer and a second electrode layer which are opposite to each other; and
a piezoelectric layer which is between the first electrode layer and the second electrode layer and comprises a plurality of piezoelectric units arranged at intervals and an insulation layer between adjacent piezoelectric units of the plurality of piezoelectric units, wherein the first electrode layer comprises a plurality of sub-electrodes corresponding to the plurality of piezoelectric units; or
the second electrode layer comprises a plurality of sub-electrodes corresponding to the plurality of piezoelectric units; or
both the first electrode layer and the second electrode layer comprise a plurality of sub-electrodes corresponding to the plurality of piezoelectric units,
wherein Young's modulus of a material of the insulation layer is smaller than Young's modulus of a material of the piezoelectric unit.

2. The piezoelectric sensor according to claim 1, wherein the plurality of piezoelectric units are arranged in an array, and the plurality of sub-electrodes are in one-to-one correspondence to the plurality of piezoelectric units.

3. The piezoelectric sensor according to claim 1, wherein the Young's modulus of the material of the insulation layer is not greater than 2 GPa.

4. The piezoelectric sensor according to claim 1, further comprising an insulation structure, wherein the insulation structure is between adjacent sub-electrodes of the plurality of sub-electrodes.

5. The piezoelectric sensor according to claim 1, wherein
one selected from a group consisting of the first electrode layer and the second electrode layer is a planar electrode, and
the other selected from the group consisting of the first electrode layer and the second electrode layer comprises the plurality of sub-electrodes corresponding to the plurality of piezoelectric units.

6. The piezoelectric sensor according to claim 1, further comprising an auxiliary layer, wherein the auxiliary layer is at at least one of the following positions:
between the first electrode layer and the piezoelectric layer; or
between the second electrode layer and the piezoelectric layer.

7. The piezoelectric sensor according to claim 1, further comprising at least one of the following elements:
an excitation source which is electrically connected with the first electrode layer and the second electrode layer to excite the plurality of piezoelectric units to generate ultrasonic waves; or
a phase controller which is electrically connected with the first electrode layer and the second electrode layer and is configured to independently modulate phase of a signal for exciting each of the plurality of piezoelectric units to generate ultrasonic waves.

8. The piezoelectric sensor according to claim 1, further comprising a piezoelectric sensing circuit, wherein the piezoelectric sensing circuit comprises a storage capacitor, a first transistor, a second transistor, a third transistor and a fourth transistor,
a control electrode of the first transistor is configured to receive a sampling control signal, a first electrode of the first transistor is configured to receive a bias signal,
the second electrode layer, a second electrode of the first transistor, a first terminal of the storage capacitor and a control electrode of the second transistor are connected to a first node,
a second terminal of the storage capacitor is connected to a first power supply voltage, a second electrode of the second transistor is connected to the first power supply voltage, a first electrode of the second transistor, a second electrode of the third transistor and a first electrode of the fourth transistor are connected to a second node,
a control electrode of the third transistor and a first electrode of the third transistor are configured to receive a second power supply voltage,
and a control electrode of the fourth transistor is configured to receive an output control signal.

9. The piezoelectric sensor according to claim 1, further comprising a substrate, wherein the substrate is on a side of the first electrode layer away from the piezoelectric layer.

10. An electronic device, comprising the piezoelectric sensor according to claim 1.

11. The electronic device according to claim 10, further comprising:
a display screen, wherein the piezoelectric sensor is on a side of the display screen away from a light emitting side.

12. The electronic device according to claim 11, further comprising a cover plate, wherein the cover plate is on a side of the display screen away from the piezoelectric sensor and a thickness of the cover plate is in a range of 50 μm-200 μm.

13. A method for recognizing a fingerprint, comprising:
exciting a piezoelectric sensor by an excitation source to generate ultrasonic waves; and
receiving the ultrasonic waves reflected by a finger by the piezoelectric sensor and converting the ultrasonic waves that are received into electrical signals to realize fingerprint recognition,
wherein the piezoelectric sensor comprises:
a first electrode layer and a second electrode layer which are opposite to each other; and
a piezoelectric layer which is between the first electrode layer and the second electrode layer and comprises a plurality of piezoelectric units arranged at intervals and an insulation layer between adjacent piezoelectric units of the plurality of piezoelectric units,
wherein the first electrode layer comprises a plurality of sub-electrodes corresponding to the plurality of piezoelectric units; or
the second electrode layer comprises a plurality of sub-electrodes corresponding to the plurality of piezoelectric units; or
both the first electrode layer and the second electrode layer comprise a plurality of sub-electrodes corresponding to the plurality of piezoelectric units,
wherein Young's modulus of a material of the insulation layer is smaller than Young's modulus of a material of the piezoelectric unit.

14. The method according to claim 13, wherein the piezoelectric sensor further comprises a phase controller, the phase controller is electrically connected with the first electrode layer and the second electrode layer, and
exciting the piezoelectric sensor by the excitation source to generate ultrasonic waves comprises:
independently modulating phase of a signal used for exciting each of the piezoelectric units to generate the ultrasonic waves by the phase controller.

15. The method according to claim 14, wherein
independently modulating phase of the signal used for exciting each of the piezoelectric units to generate the ultrasonic waves comprises:
adjusting phases of signals applied to the plurality of piezoelectric units so that the ultrasonic waves generated by the plurality of piezoelectric units have a maximum amplitude at a set position.

16. The method according to claim 15, further comprising:
adjusting the phases of the signals applied to the plurality of piezoelectric units to change a direction of the maximum amplitude that is formed, so that the direction of the maximum amplitude is capable of being changed along a predetermined route.

17. The method according to claim 13, further comprising:
converting the electrical signals, converted by the plurality of piezoelectric units, from AC signals to DC signals by a piezoelectric sensing circuit in the piezoelectric sensor;
respectively storing the DC signals in a storage capacitor of the piezoelectric sensing circuit;
and sequentially outputting the DC signals to a peripheral signal processor in a signal readout stage.

18. A method of manufacturing a piezoelectric sensor, comprising:
forming a second electrode layer on a base substrate;
forming a plurality of piezoelectric units arranged at intervals and an insulation layer between adjacent piezoelectric units of the plurality of piezoelectric units on the second electrode layer; and
forming a first electrode layer on a side of the piezoelectric units away from the second electrode layer,
wherein the first electrode layer comprises a plurality of sub-electrodes corresponding to the plurality of piezoelectric units; or
the second electrode layer comprises a plurality of sub-electrodes corresponding to the plurality of piezoelectric units; or
both the first electrode layer and the second electrode layer comprise a plurality of sub-electrodes corresponding to the plurality of piezoelectric units,
wherein Young's modulus of a material of the insulation layer is smaller than Young's modulus of a material of the piezoelectric unit.

19. The method according to claim 18, wherein
before forming the second electrode layer on the base substrate, the method further comprises:
forming a piezoelectric sensing circuit on the base substrate, wherein the piezoelectric sensing circuit is between the second electrode layer and the base substrate; and
in a case where the second electrode layer comprises a plurality of sub-electrodes corresponding to the plurality of piezoelectric units, forming the plurality of piezoelectric units arranged at intervals and the insulation layer between adjacent piezoelectric units of the plurality of piezoelectric units on the second electrode layer comprises:
coating a polyvinylidene fluoride film on a side of the plurality of sub-electrodes away from the base substrate in a spinning manner, forming the plurality of piezoelectric units arranged in an array using the polyvinylidene fluoride film, and forming the insulation layer at gaps between the adjacent piezoelectric units.

* * * * *